(12) United States Patent
Shin

(10) Patent No.: US 9,307,628 B2
(45) Date of Patent: Apr. 5, 2016

(54) CIRCUIT BOARD ASSEMBLY USING METAL PLATES AS CONDUCTING MEDIUM EMBEDDED THEREIN

(71) Applicant: KING SHING INDUSTRIAL CO., LTD., Taoyuan County (TW)

(72) Inventor: Chun-Chin Shin, Taoyuan County (TW)

(73) Assignee: KING SHING INDUSTRIAL CO., LTD., Taoyuan County (TW)

( * ) Notice: Subject to any disclaimer, the term of this patent is extended or adjusted under 35 U.S.C. 154(b) by 253 days.

(21) Appl. No.: 13/868,575

(22) Filed: Apr. 23, 2013

(65) Prior Publication Data
US 2014/0233189 A1  Aug. 21, 2014

(30) Foreign Application Priority Data
Feb. 18, 2013  (TW) .............................. 102105650 A

(51) Int. Cl.
| | |
|---|---|
| H05K 7/20 | (2006.01) |
| H05K 1/03 | (2006.01) |
| H05K 1/16 | (2006.01) |
| B23P 19/00 | (2006.01) |
| H05K 1/02 | (2006.01) |
| H05K 1/18 | (2006.01) |
| H05K 3/20 | (2006.01) |
| G06F 1/20 | (2006.01) |
| H05K 1/14 | (2006.01) |

(52) U.S. Cl.
CPC ................ *H05K 1/02* (2013.01); *H05K 1/0203* (2013.01); *H05K 1/182* (2013.01); *H05K 3/202* (2013.01); *G06F 1/20* (2013.01); *H05K 1/141* (2013.01); *H05K 1/144* (2013.01); *H05K 2201/042* (2013.01); *H05K 2201/09027* (2013.01); *H05K 2201/09063* (2013.01); *H05K 2201/09118* (2013.01); *H05K 2201/10583* (2013.01)

(58) Field of Classification Search
CPC ............. G06F 1/20; G06F 1/203; H05K 1/02; H05K 1/0203; H05K 7/20; H05K 7/209; H05K 9/00
USPC .......... 361/711–714, 720; 174/255, 260, 261; 29/739–741
See application file for complete search history.

(56) References Cited

U.S. PATENT DOCUMENTS

| | | | |
|---|---|---|---|
| 6,400,044 B1 * | 6/2002 | Lohberg et al. .................. | 307/91 |
| 2011/0044009 A1 * | 2/2011 | Fukuda et al. ................ | 361/720 |
| 2013/0329356 A1 * | 12/2013 | Shanbhogue et al. ... | 361/679.47 |

* cited by examiner

*Primary Examiner* — Courtney Smith
*Assistant Examiner* — Zhengfu Feng
(74) *Attorney, Agent, or Firm* — Ming Chow; Sinorica, LLC

(57) ABSTRACT

A circuit board assembly includes metal plates to be used as conducting medium, an encapsulation enclosing therein the metal plates and provided with holes defined in the encapsulation to allow extension of the metal plates out of the encapsulation for electrical connection and electronic components securely mounted on the encapsulation and electrically connected to the metal plates to form a closed loop.

6 Claims, 7 Drawing Sheets

CIRCUIT BOARD ASSEMBLY USING METAL PLATES AS CONDUCTING MEDIUM EMBEDDED THEREIN

CROSS-REFERENCE TO RELATED APPLICATION

The current application claims a foreign priority to the patent application of Taiwan No. 102105650 filed on Feb. 18, 2013.

FIELD OF THE INVENTION

The invention relates to a circuit board assembly, and more particularly, to a circuit board assembly using metal plates as conducting medium embedded inside the circuit board assembly so as to strengthen endurance to withstand severe working conditions.

BACKGROUND OF THE INVENTION

Nowadays, printed circuit board (PCB) is widely used in various fields to allow electronic components mounted thereon to connect to other assemblies so as to accomplish the predetermined objectives. Normally, the PCB is composed of an insulation substrate and wirings specially designed in accordance with different requirements and embedded therein so as to allow electronic components mounted on the insulation substrate thereafter to electrically connect to other assemblies via the connection of the wirings. Before the formation of the wirings, a layer of copper foil is provided on top of the insulation substrate. Then a removal process, such as an etching process, is applied to the copper foil to remove unnecessary part of the copper foil. What is left on the surface of the insulation substrate becomes a mesh-like wiring. This mesh-like wiring is called conducting wiring or layout to provide electrical connection for the electronic components mounted on the insulation substrate.

Some sort of the substrates is made of aluminum or iron and the wiring is formed on the surface of the aluminum or iron substrate. This type of printed circuit board is largely used in the engine bay of automobiles. And it is a well known phenomenon that the longer the engine keeps running, the higher temperature the engine bay becomes. Under such severe working conditions, some passive electronic components welded on the substrate may therefore fall off from the substrate due to the effect of the heat so generated by the working of the engine as well as that so generated by the working of the passive electronic components.

SUMMARY OF THE INVENTION

The primary objective of the present invention is to provide a circuit board assembly using metal plate as conducting medium so as to strengthen endurance of the circuit board assembly to withstand severe working conditions.

In a preferred embodiment of the present invention, the objective of the present invention is to provide a circuit board assembly having metal plates to be used as conducting medium, an encapsulation enclosing therein the metal plates and provided with holes defined in the encapsulation to allow extension of the metal plates out of the encapsulation for electrical connection.

In a preferred embodiment, the circuit board assembly is able to form a closed loop.

In still a preferred embodiment of the present invention, the circuit board assembly further has electronic components mounted on the encapsulation.

In yet another preferred embodiment of the present invention, the encapsulation has first holes defined in a top face thereof to allow the extension of the metal plates for electrical connection and second holes defined in a bottom face thereof to allow dissipating of heat generated by the electronic components.

Still another objective of the present invention is to provide a circuit board assembly having a printed circuit board composed of a substrate and wirings formed inside the substrate and made of copper foils, a digital/analog converter, an analog/digital converter, metal plates formed inside and partly exposed out of the substrate for electrical connection and an encapsulation partly enclosing the printed circuit board and the metal plates to allow electronic components mounted on the encapsulation to electrically connect to the wiring and the metal plates.

In a preferred embodiment of the present invention, the metal plate is made of conducting material or alloy.

In a preferred embodiment of the present invention, the electronic components are passive electronic components.

In still a preferred embodiment of the present invention, the encapsulation has first holes defined in a top surface thereof to partly expose the wiring as well as the metal plates for electrical connection and second holes defined in a bottom surface thereof to dissipate heat generated by the electronic components.

In yet a still other objective of the preferred embodiment of the present invention is to provide a circuit board assembly having a printed circuit board composed of a substrate and wirings formed inside the substrate and made of copper foils, a digital/analog converter formed on the printed circuit board, an analog/digital converter formed on the printed circuit board, an encapsulation enclosing the printed circuit board, electronic components formed on the encapsulation and metal plates formed inside the encapsulation and partly exposed out of the encapsulation for electrical connection to the electronic components.

In a preferred embodiment of the present invention, the electronic components are passive electronic components.

In still a preferred embodiment of the present invention, the encapsulation has first holes defined in a top surface thereof to partly expose the metal plates for electrical connection and second holes defined in a bottom surface thereof to dissipate heat generated by the electronic components.

In a preferred embodiment of the present invention, the metal plate is made of conducting material or alloy.

In a preferred embodiment of the present invention, the electronic components are passive electronic components.

DETAILED DESCRIPTION OF THE PREFERRED EMBODIMENTS

Figure 1:
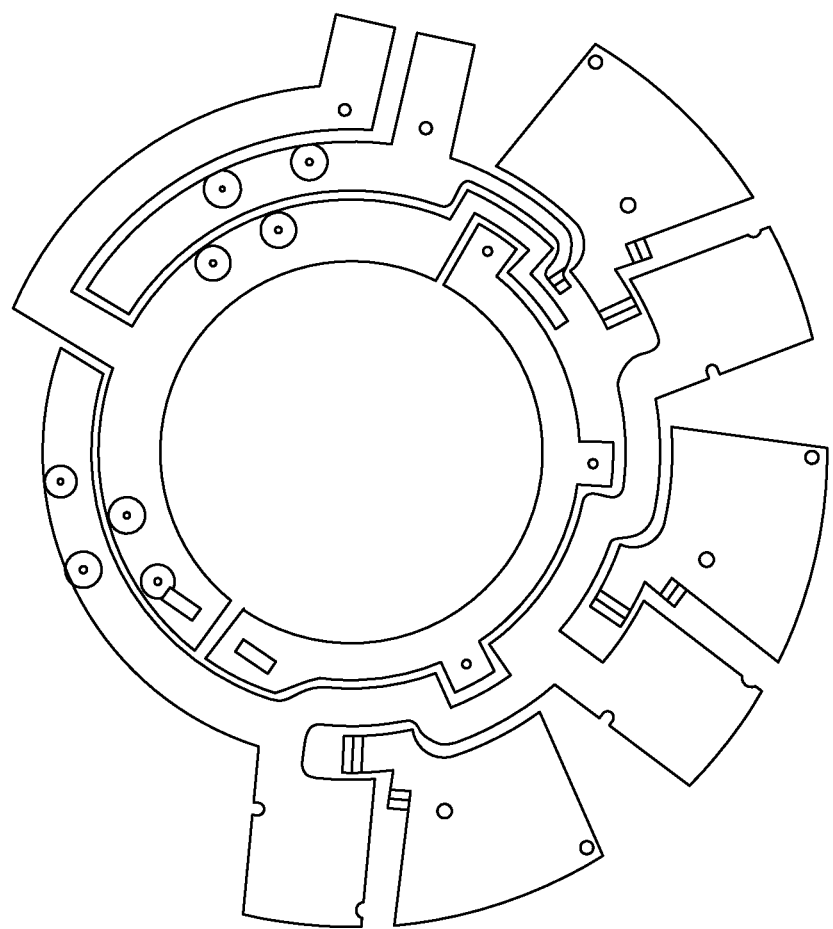
FIG. 1 is a plan view of a preferred embodiment of the circuit board of the present invention.

With reference to FIG. 1, a plurality of metal plates 10 used in the circuit board assembly constructed in accordance with the preferred embodiment of the present invention is shown.

Figure 2:
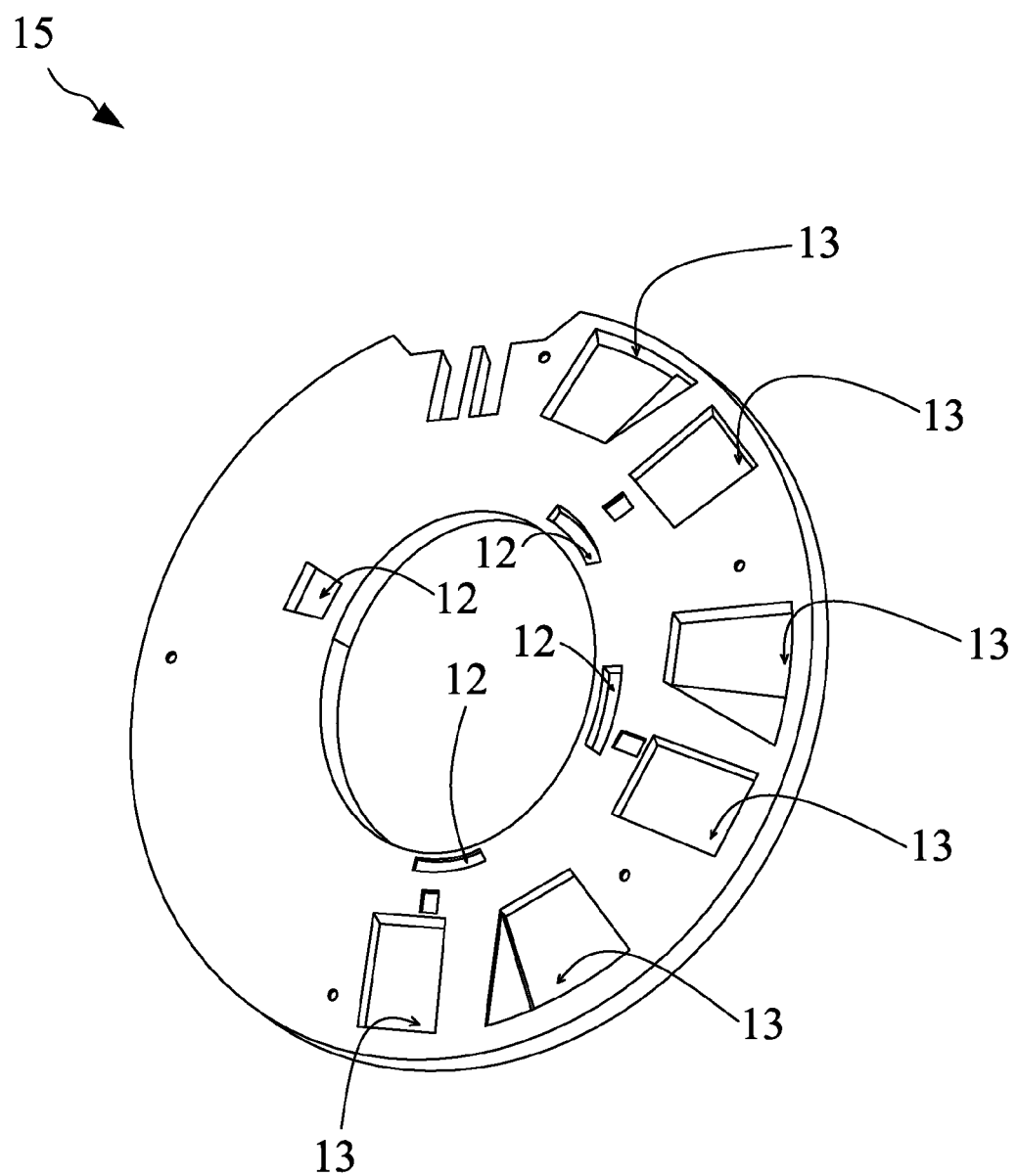
FIG. 2 is a perspective view showing the encapsulation of the preferred embodiment of the present invention.

FIG. 2 shows a preferred embodiment of the encapsulation 15 of the present invention, wherein the encapsulation 15 has first holes 12 and second holes 13. The first holes 12 are blind holes and the second holes 13 are through holes.

Figure 3:
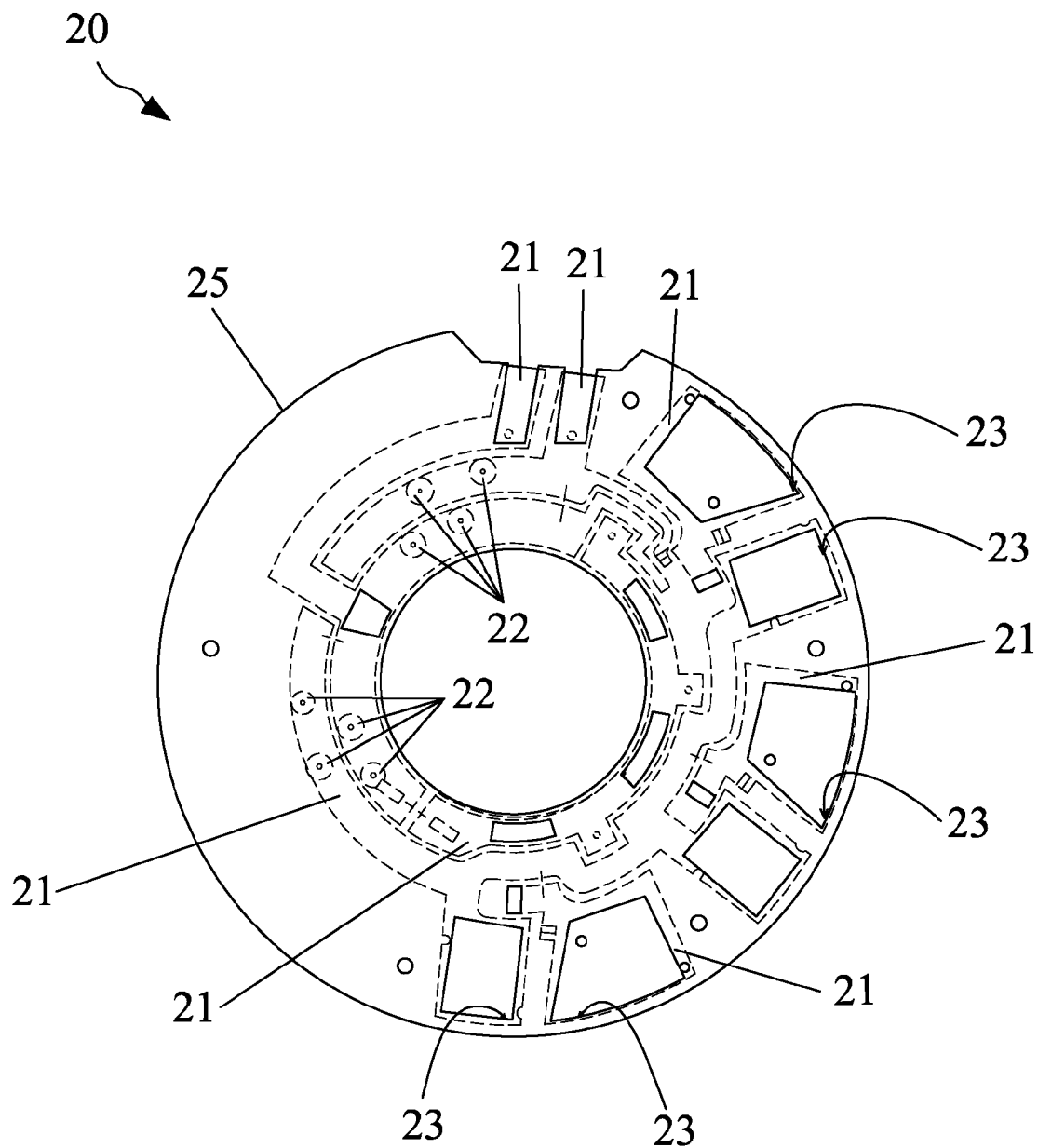
FIG. 3 is a plan view showing the structure of the circuit board assembly of the preferred embodiment of the present invention.
Figure 4:
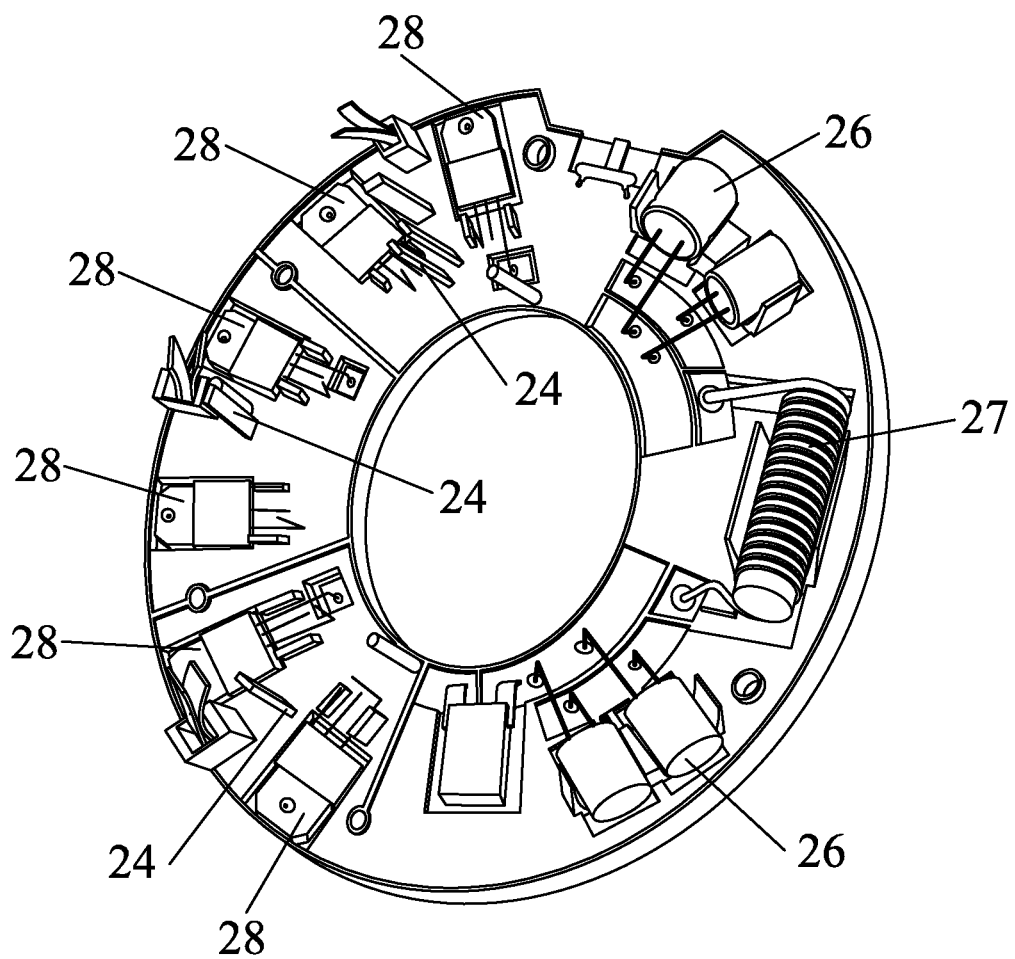
FIG. 4 is a perspective view showing the circuit board assembly and electronic components mounted thereon.

With reference to FIGS. 3 and 4, it is noted that the circuit board assembly 20 constructed in accordance with the present invention has metal plates 21, an encapsulation 25 partly enclosing the metal plates 21 therein and electronic components 26, 27 and 28. Each of the metal plates 21 has geometric shape and allows current to pass thereby. The metal plate 21 is not wiring on the so-called printed circuit board, but still has the abilities of normal wirings. Each of the metal plate 21 has to be customarily made and then put them together to form a functioning circuit. This type of circuit made of metal plates 21 is able to reduce copper loss and increase endurance of critical working conditions such that it is suitable for equipment using large current.

The encapsulation 25 partly encloses therein the metal plates 21 and separates the metal plates 21 from engaging with one another to form a short. The electronic components 26, 27 and 28 are securely arranged a surface of the encapsulation 25 and electrically and respectively connected to a corresponding one of the metal plates 21 to form a complete circuit. It is also noted that the blind holes 22 in the encapsulation 25 allows a part of the metal plates 21 to be exposed out of the encapsulation 25 for electrical connection to the electronic components 26, 27 and 28. Another embodiment shows that the electronic components 26, 27 and 28 may also be respectively welded directly on the corresponding one of the metal plates 21 to form a complete circuit loop. Due to different functions and requirements, each of the metal plates 21 may have different geometric shapes with one another such that after the metal plates 21 are combined with the encapsulation 25, the circuit board assembly 20 may have a circular shape or polygon. Again, the through holes 23 defined in the encapsulation 25 allow the metal plates 21 to expose from both sides of the encapsulation 25. An area of each of the through holes 23 is larger than that of the blind hole 22 such that after the electronic components 26, 27 and 28 are securely mounted on the corresponding metal plates 21 on one side of the encapsulation 25, heat generated from the operation of the electronic components 26, 27 and 28 dissipates from the other side of the encapsulation 25, which increases the thermal dissipation efficiency and prolongs the lifespan of the electronic components 26, 27 and 28 as the heat dissipates quickly. Also, the electronic components 26, 27 and 28 may include passive components and/or driving elements.

In a preferred embodiment of the circuit board assembly of the present invention, the closed circuit loop formed by the metal plates 21 needs to connect to a power source to initiate the electronic components such that a vertical part of the metal plates 21 extends out of the encapsulation 25 to form a contact 24. The encapsulation 25 securely encloses therein the horizontal part of the metal plates 21 and avoids the metal plates 21 from engaging with one another to form a short.

Figure 5:
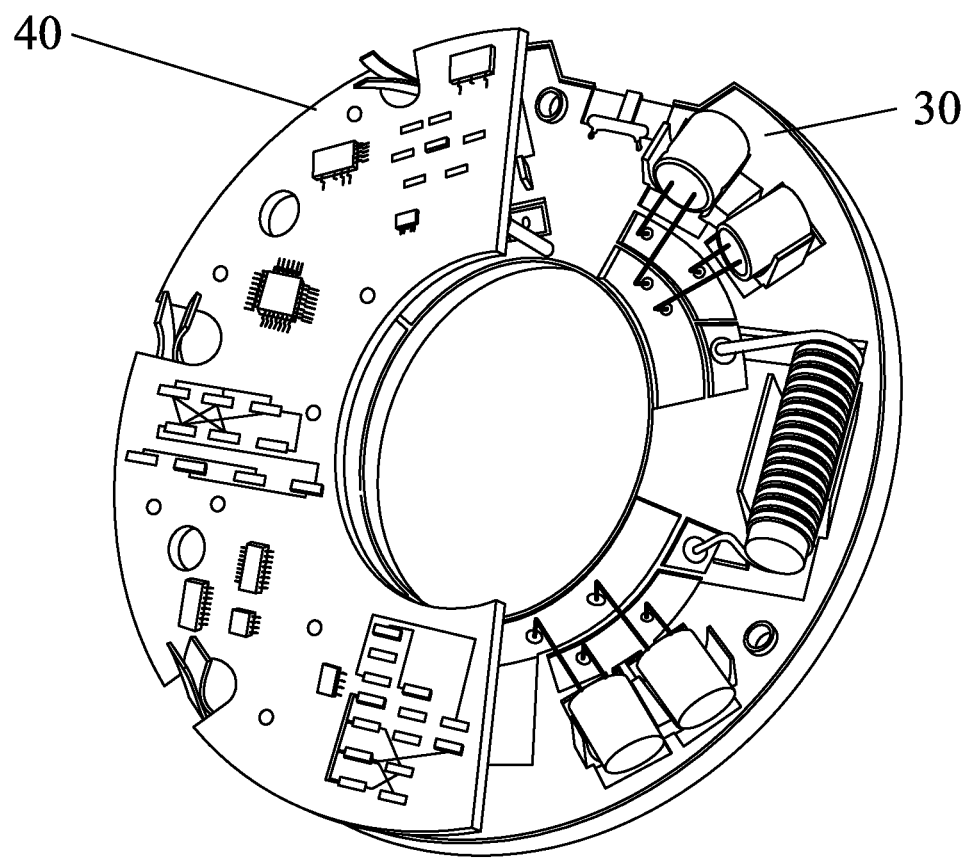
FIG. 5 is a perspective view showing still another preferred embodiment of the present invention.

With reference to FIG. 5, the circuit board assembly constructed in accordance with the preferred embodiment of the present invention is specially used in a transportation vehicle. For that purpose, a printed circuit board is added to the assembly of the present invention and includes at least a digital/analog converter. The printed circuit board may also include controlling elements and operational elements so that under the control of a clock signal, the controlling elements control the operation and execution of the operational elements. It is noted from this embodiment that the printed circuit board may have a substrate 40 which may be integrated with the encapsulation 30. Inside the printed circuit board, there are wirings made of copper foils. The metal plates 21 disclosed in the preferred embodiment of the present invention may also be embedded in the combination of the substrate 40 and the encapsulation. That is, in this embodiment of the present invention, the circuit board assembly constructed in accordance with the present invention includes wirings 41 inside the combination of the substrate 40 and the encapsulation and the metal plates 21 (not shown in this embodiment) are partly enclosed by the combination of the substrate 40 and the encapsulation and partly extended out therefrom to form contacts 24 with the electronic components.

Figure 6:
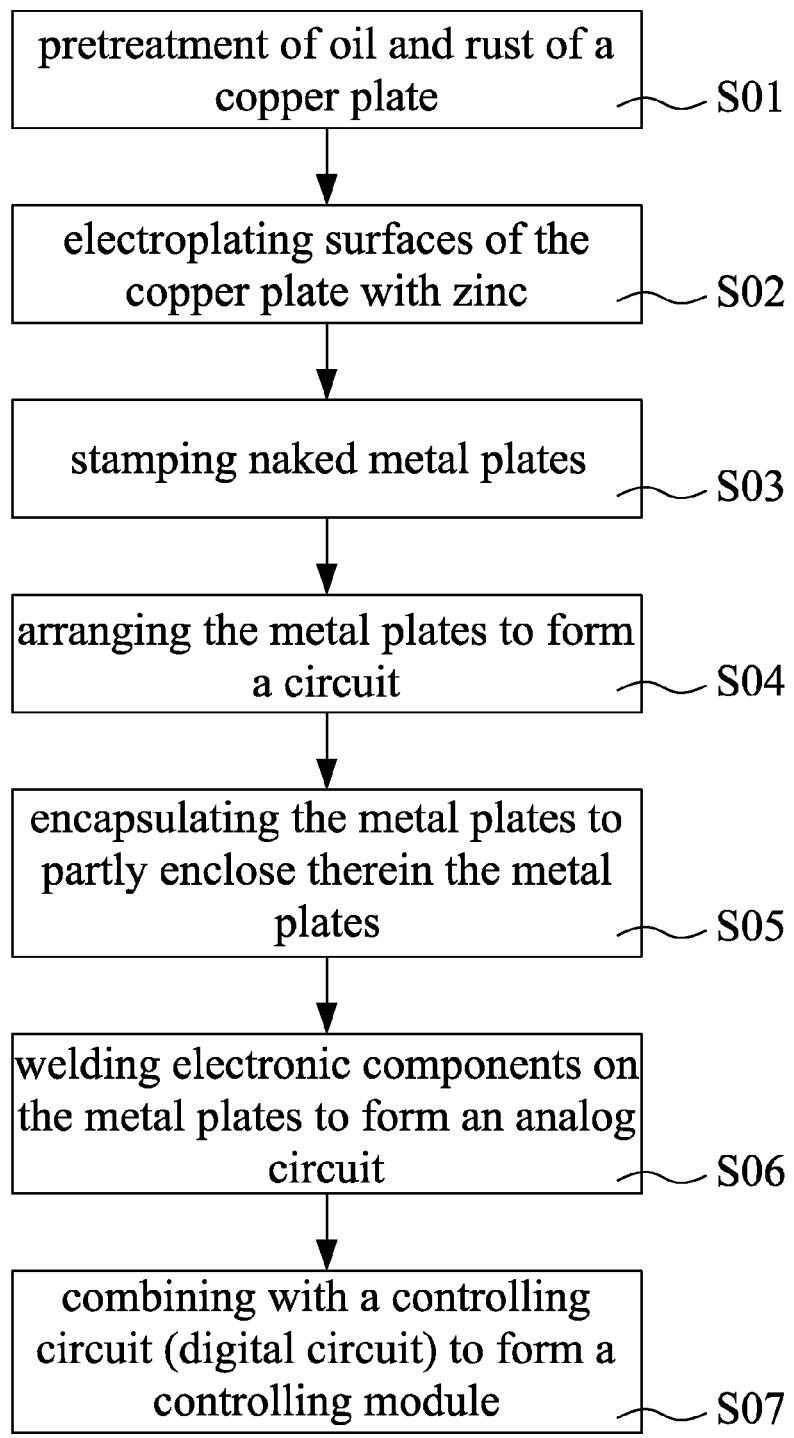
FIG. 6 is a flow chart showing the steps for making the structure of the present invention.

With reference to FIG. 6, it is shown the method for making circuit board assembly of the preferred embodiment of the present invention. The method of used in the preferred embodiment of the present invention includes the steps of:

S01: pretreatment of oil and rust of a copper plate;
S02: electroplating surfaces of the copper plate with zinc;
S03: stamping naked metal plates;
S04: arranging the metal plates to form a circuit;
S05: encapsulating the metal plates to partly enclose therein the metal plates;
S06: welding electronic components on the metal plates to form an analog circuit; and
S07: combining with a controlling circuit (digital circuit) to form a controlling module.

Figure 7:
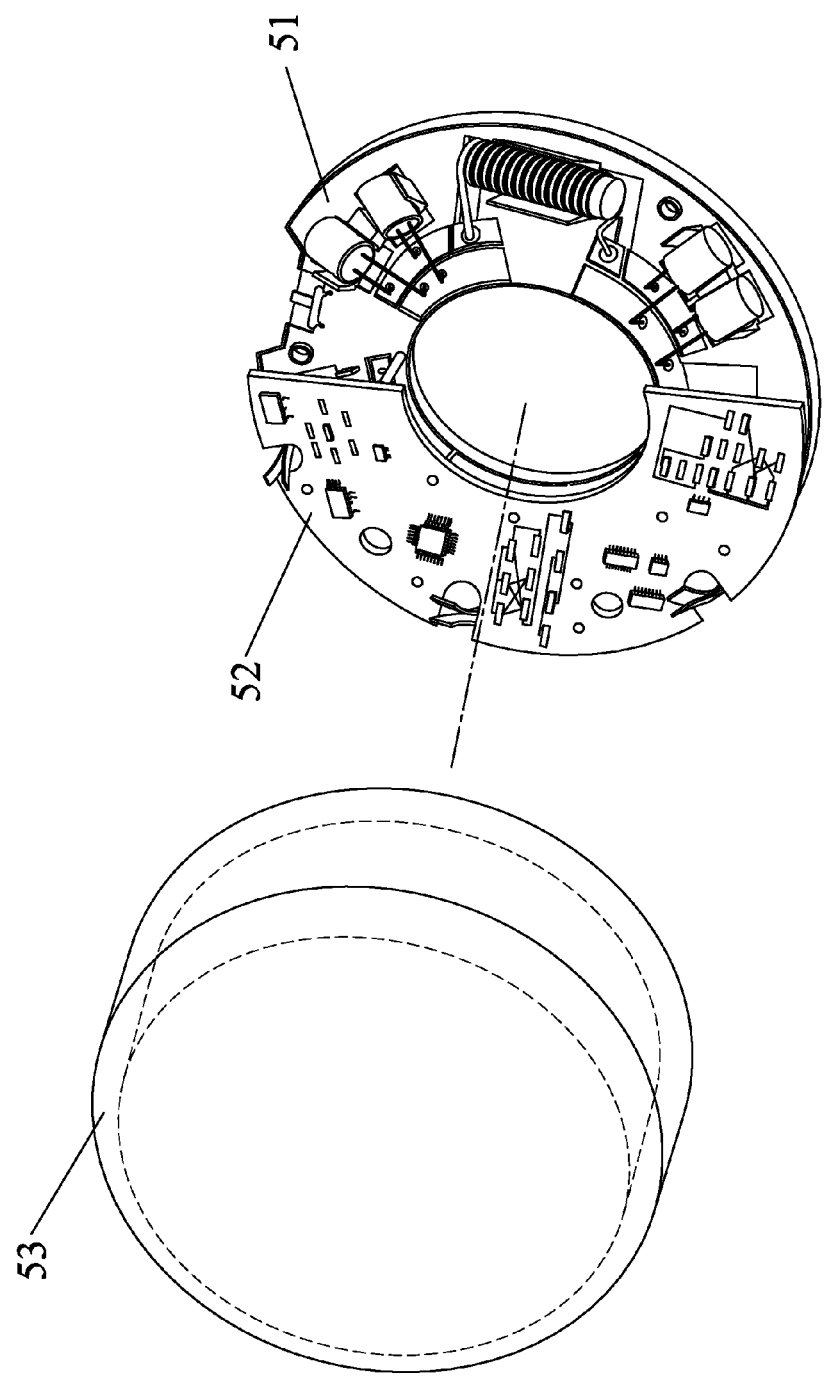
FIG. 7 is a perspective view of the preferred embodiment of the present invention with the encapsulation separated therefrom.

With reference to FIG. 7, still another preferred embodiment of the present invention is shown, wherein the printed circuit board 52 having thereon at least one digital/analog converter and at least one analog/digital converter is integrated with a circuit 51 formed by the metal plates. Then the encapsulation 53 is provided to enclose the printed circuit board 52 as well as the circuit of the metal plates. After the encapsulation 53 encloses therein the printed circuit board 52 and the circuit form by the metal plates, contact is used to electrically connect the two such that analog ground signal is separated from the digital ground signal to reduce interference between the two so as to increase operation precision. The purpose of this kind of separation is to isolate large current passing by the circuit of the metal plates from small current passing by the printed circuit board.

It is noted that the circuit board assembly constructed in accordance with the present invention is formed without the use of lithography such that the end product is environment friendly. In addition, because the metal plate is much larger in size compared with the traditional wiring, the circuit board using metal plates as its circuit has high endurance to pressure, large current and drastic temperature change. Furthermore, the circuit board of the preferred embodiment of the present invention has advantages of high anti-interference capability and easy manufacture process. What is more is that the encapsulation may be recycled for reuse, which is a crucial factor in modern society.

What is claimed is:

1. A circuit board assembly comprising:
   a substrate;
   wirings formed inside the substrate and made of copper foils;
   a digital/analog converter formed on the substrate;
   an analog/digital converter formed on the substrate;
   metal plates formed inside and partly exposed out of the substrate for electrical connection;
   an encapsulation enclosing the substrate and partly enclosing the metal plate and having holes to allow extension of the metal plates; and
   electronic components mounted on the substrate to electrically connect to the wiring and the metal plates;
   wherein the metal plates are not electrically connected to printed circuit board, and are provided with electrical connections in a circuit.

2. The assembly as claimed in claim 1, wherein the metal plate is made of conducting material or alloy.

3. The assembly as claimed in claim 1, wherein the components are passive electronic components or driving elements.

4. The assembly as claimed in claim 1, wherein the substrate has first holes defined in a top surface thereof to partly expose the metal plates for electrical connection and second holes defined in a bottom surface thereof to dissipate heat generated by the electronic components.

5. The assembly as claimed in claim 2, wherein the substrate has first holes defined in a top surface thereof to partly expose the metal plates for electrical connection and second holes defined in a bottom surface thereof to dissipate heat generated by the electronic components.

6. The assembly as claimed in claim 3, wherein the substrate has first holes defined in a top surface thereof to partly expose the metal plates for electrical connection and second holes defined in a bottom surface thereof to dissipate heat generated by the electronic components.

* * * * *